United States Patent
Blanchard et al.

(10) Patent No.: US 7,202,494 B2
(45) Date of Patent: Apr. 10, 2007

(54) FINFET INCLUDING A SUPERLATTICE

(75) Inventors: Richard A. Blanchard, Los Altos, CA (US); Kalipatnam Vivek Rao, Grafton, MA (US); Scott A. Kreps, Waltham, MA (US)

(73) Assignee: RJ Mears, LLC, Waltham, MA (US)

( * ) Notice: Subject to any disclaimer, the term of this patent is extended or adjusted under 35 U.S.C. 154(b) by 0 days.

(21) Appl. No.: 11/426,969

(22) Filed: Jun. 28, 2006

(65) Prior Publication Data

US 2006/0292889 A1    Dec. 28, 2006

Related U.S. Application Data

(63) Continuation-in-part of application No. 10/992,422, filed on Nov. 18, 2004, now Pat. No. 7,071,119, which is a continuation of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003, now abandoned.

(51) Int. Cl.
    *H01L 29/06* (2006.01)
(52) U.S. Cl. .................... 257/9; 257/9; 257/15; 257/18; 257/E39.011; 438/761
(58) Field of Classification Search ............... 257/9, 257/15, 18, 19, 22, 28, E33.09
See application file for complete search history.

(56) References Cited

U.S. PATENT DOCUMENTS

| | | | |
|---|---|---|---|
| 4,485,128 A | 11/1984 | Dalal et al. | 427/85 |
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,937,204 A | 6/1990 | Ishibashi et al. | 437/110 |

(Continued)

FOREIGN PATENT DOCUMENTS

EP    0 843 631    5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Andy Huynh
*Assistant Examiner*—Thinh T Nguyen
(74) *Attorney, Agent, or Firm*—Allen, Dyer, Doppelt, Milbrath & Gilchrist, P.A.

(57) ABSTRACT

A semiconductor device may include at least one fin field-effect transistor (FINFET) comprising a fin, source and drain regions adjacent opposite ends of the fin, and a gate overlying the fin. The fin may include at least one superlattice including a plurality of stacked groups of layers. Each group of layers may include a plurality of stacked base semiconductor monolayers defining a base semiconductor portion, and at least one non-semiconductor monolayer constrained within a crystal lattice of adjacent base semiconductor portions.

23 Claims, 20 Drawing Sheets

U.S. PATENT DOCUMENTS

| | | | |
|---|---|---|---|
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,519 B2 | 2/2003 | Kamath et al. | 438/786 |
| 6,566,679 B2 | 5/2003 | Nikonov et al. | 257/29 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,711,191 B1 | 3/2004 | Kozaki et al. | 372/43 |
| 6,748,002 B2 | 6/2004 | Shveykin | 372/45 |
| 6,816,530 B2 | 11/2004 | Capasso et al. | 372/50 |
| 6,855,990 B2 * | 2/2005 | Yeo et al. | 257/353 |
| 2002/0094003 A1 | 7/2002 | Bour et al. | 372/46 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |

FOREIGN PATENT DOCUMENTS

| | | |
|---|---|---|
| GB | 2347520 | 9/2000 |
| JP | 61027661 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optolectronics*, 1999-2003, pp. 1-6.

Fan et al., *N- and P- Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

Wu et al., *Stacked 3-D Fin-CMOS Technology*, IEEE Electron Device Letters, vol. 26, No. 6, Jun. 2005, pp. 416-418.

Moore, *No Exponential is Forever: But "Forever" Can Be Delayed!*, 2003 IEEE International Solid-State Circuits Conference, pp. 20-23.

Ananthan, *FinFET-Current Research Issues*, Spring 2003, available at http://web.ics.purdue.edu/~hanantha/academics.shtml.

Parton et al., *MuGFET Processing Challenges and Demonstration of a 45 nm Node 6T-SRAM Cell*, Future FAB International, Issue 19, 2005, pp. 24-27.

\* cited by examiner

FINFET INCLUDING A SUPERLATTICE

CROSS-REFERENCE TO RELATED APPLICATIONS

This application is a continuation-in-part of U.S. patent application Ser. No. 10/992,422 filed Nov. 18, 2004 now U.S. Pat. No. 7,071,119, which is a continuation of U.S. patent application Ser. No. 10/647,060 filed Aug. 22, 2003, now U.S. Pat. No. 6,958,486, which is a continuation-in-part of U.S. patent application Ser. Nos. 10/603,696 and 10/603,621 filed on Jun. 26, 2003 now abandoned, the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices Published U.S. patent application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391–402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller devices and new device configurations, such as fin field-effect transistors (FINFETs), for example.

SUMMARY OF THE INVENTION

In view of the foregoing background, it is therefore an object of the present invention to provide a FINFET device having enhanced mobility characteristics.

This and other objects, features, and advantages in accordance with the present invention are provided by a semiconductor device which may include at least one fin field-effect transistor (FINFET) comprising a fin, source and drain regions adjacent opposite ends of the fin, and a gate overlying the fin. The fin may include at least one superlattice including a plurality of stacked groups of layers. Each group of layers may include a plurality of stacked base semiconductor monolayers defining a base semiconductor portion, and at least one non-semiconductor monolayer constrained within a crystal lattice of adjacent base semiconductor portions.

More particularly, the semiconductor may further include a substrate supporting the at least one FINFET, and the fin may include a pair of spaced apart superlattices and a semiconductor layer therebetween with groups of layers of each superlattice being stacked in a lateral direction. Alternately, the fin may include a single superlattice with groups of layers stacked in a vertical direction. The substrate may include an uppermost insulating layer supporting the at least one FINFET. Furthermore, the gate may include a gate dielectric layer and a gate electrode layer overlying the gate dielectric layer.

At least one group of layers of the at least one superlattice may be substantially undoped. Also, the base semiconductor may comprise silicon, and the at least one non-semiconductor monolayer may comprise oxygen. More particularly, at least one non-semiconductor monolayer may comprise a non-semiconductor selected from the group consisting essentially of oxygen, nitrogen, fluorine, and carbon-oxygen.

In addition, the at least one non-semiconductor monolayer may be a single monolayer thick. In some embodiments, all of the base semiconductor portions may be a same number of monolayers thick. Alternately, at least some of the base semiconductor portions may be a different number of monolayers thick. Furthermore, opposing base semiconductor portions in adjacent groups of layers of the at least one superlattice may be chemically bound together. Also, the at least one FINFET may be a plurality of FINFETS having different channel conductivities to thereby provide a CMOS device.

DETAILED DESCRIPTION OF THE PREFERRED EMBODIMENTS

Figure 1:
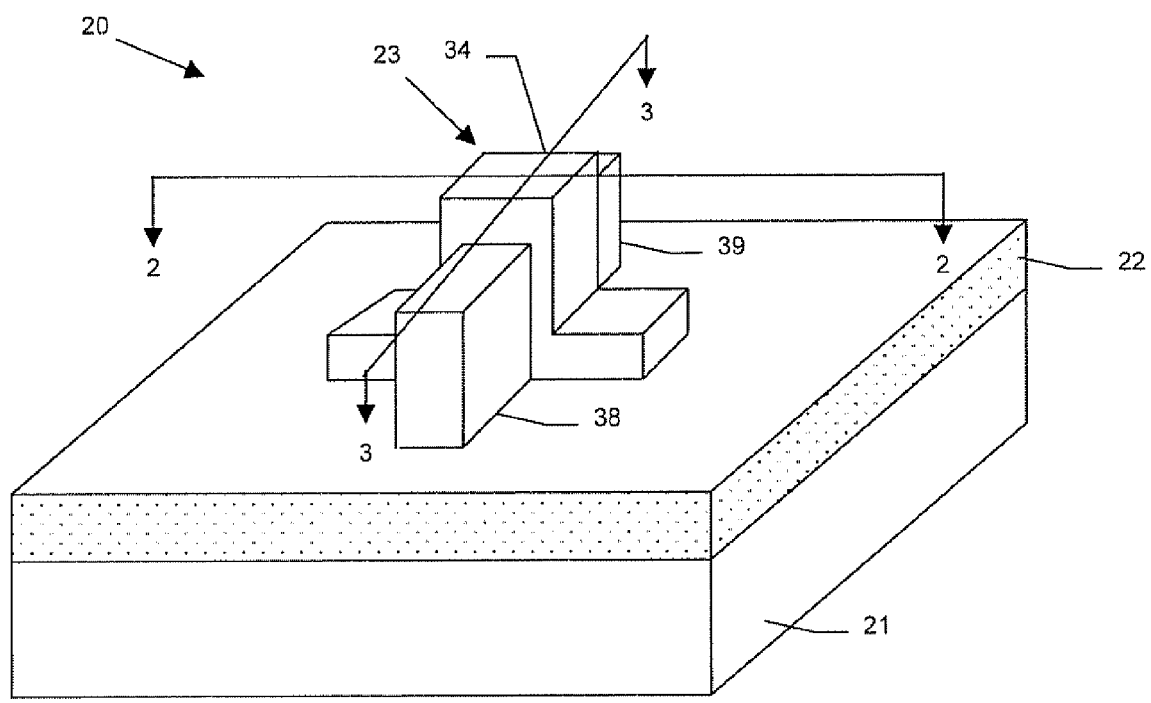
FIG. 1 is perspective view of a semiconductor device in accordance with the present invention including a superlattice.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments. Furthermore, the dimensions of certain regions and layers may be exaggerated for clarity of illustration.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{BZ} f(E(k,n), E_F, T) d^3k}$$

for electrons and:

$$M_{h,i,j}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{BZ} (1 - f(E(k,n), E_F, T)) d^3k}$$

for holes, where f is the Fermi-Dirac distribution, $E_F$ is the Fermi energy, T is the temperature (Kelvin), E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes prespectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material used as a dopant blocking layer in a semiconductor device. A FINFET 20 including the superlattice 25 in accordance with the invention is first described with reference to FIGS. 1–3. One skilled in the art, however, will appreciate that the materials identified herein could be used in many different types of semiconductor devices, such as discrete devices and/or integrated circuits.

The illustrated FINFET 20 is supported by a substrate 21 with an uppermost insulating layer 22 thereon The insulating layer 22 is indicated with stippling for clarity of illustration. The FINFET 20 illustratively includes a fin 23, source and drain regions or extensions 26, 27 adjacent opposite sides of the fin, and a gate overlying the fin. More particularly, the fin 23 illustratively includes a pair of spaced apart superlattices 25a, 25b and a semiconductor layer 28, and the gate includes a gate dielectric layer 37 and a gate electrode layer 36 overlying the gate dielectric layer. Of course, it will be appreciated by those skilled in the art that other numbers of superlattices 25 may be used in the fin 23.

Respective silicide layers 30, 31 and corresponding contact layers 32, 33 overly the source 26 and drain 27, and a silicide layer 34 overlies the gate electrode layer. Furthermore, nitride spacers 38, 39 may be positioned laterally adjacent the source and drain regions 26, 27 to provide isolation between adjacent FINFETs when more than one FINFET 20 is used. Nitride spacers 40, 41 may also be used to isolate the source and drain silicide layers 30, 31 from the gate electrode layer 36 and the silicide layer 34 that overlies the gate electrode layer. It should be noted that the contacts to the source and drain regions 26, 27 are illustratively made on the top surface of the contact layers 32, 33 in FIG. 3, but it is also possible to contact the source and drain regions on the side or on the end of the structure in other embodiments.

Figure 2:
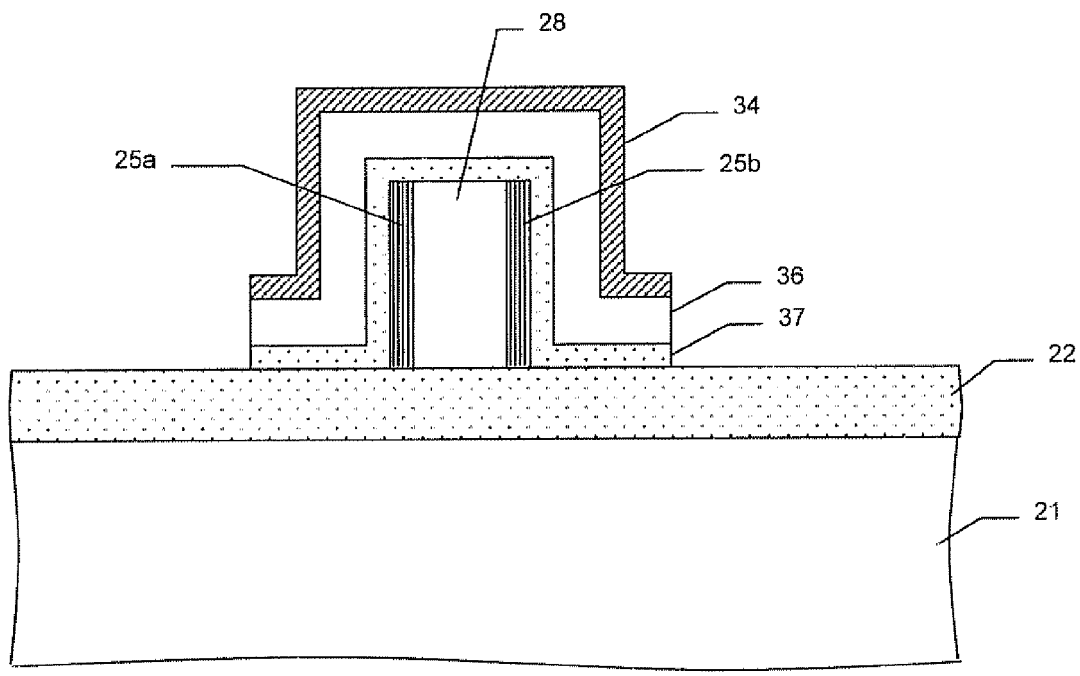
FIG. 2 is a schematic cross-sectional diagram of the semiconductor device of FIG. 1 taken along the line 2—2.

It should also be noted that the semiconductor layer 28 may be a high resistivity material if the two superlattice channel regions shown in FIG. 2 are to be electrically isolated. The conductivity type of the semiconductor layer 28 and the superlattice layers 28a and 28b are also preferably chosen to provide desired device performance by reducing unwanted channel-to-channel communication if there are to be two separate devices present, as will be appreciated by those skilled in the art.

As will be discussed further below with respect to FIGS. 5 and 6, each of the superlattices 25a, 25b includes a plurality of stacked groups of layers 45a–45n, with each group of layers including a plurality of stacked base semiconductor monolayers 46 defining a base semiconductor portion 46a–46n, and at least one non-semiconductor monolayer constrained within a crystal lattice of adjacent base semiconductor portions. In the illustrated embodiment, it may be seen that the groups of layers 45a–45n of each superlattice 25a, 25b are stacked in a lateral direction. The channel of the FINFET will therefore be defined in the superlattices 25a, 25b along the lateral sidewalls of the fin 23, although portions of the channel may also be formed in the semiconductor layer 28 as well, as will be appreciated by those skilled in the art. Further details on using such a superlattice as a channel in a semiconductor device are provided in U.S. application Ser. No. 10/647,069, which is assigned to the present Assignee and is hereby incorporated in its entirety herein by reference, for example.

In accordance with an alternate embodiment now discussed with reference to FIG. 4, two laterally adjacent FINFETs 20a' and 20b' each have a single respective superlattice 125a', 125b'. Moreover, each superlattice 125a', 125b' has a different conductivity type (P and N, respectively) to thereby provide a CMOS device. The groups of layers 45a–45n of the superlattices 125a', 125b' are also stacked vertically in the illustrated embodiment, rather than laterally as in the preceding embodiment.

Applicants have identified improved materials or structures for the superlattice 25 of the FINFET 20. More specifically, the Applicants have identified materials or structures having energy band structures for which the appropriate conductivity effective masses for electrons and/or holes are substantially less than the corresponding values for silicon.

Figure 5:
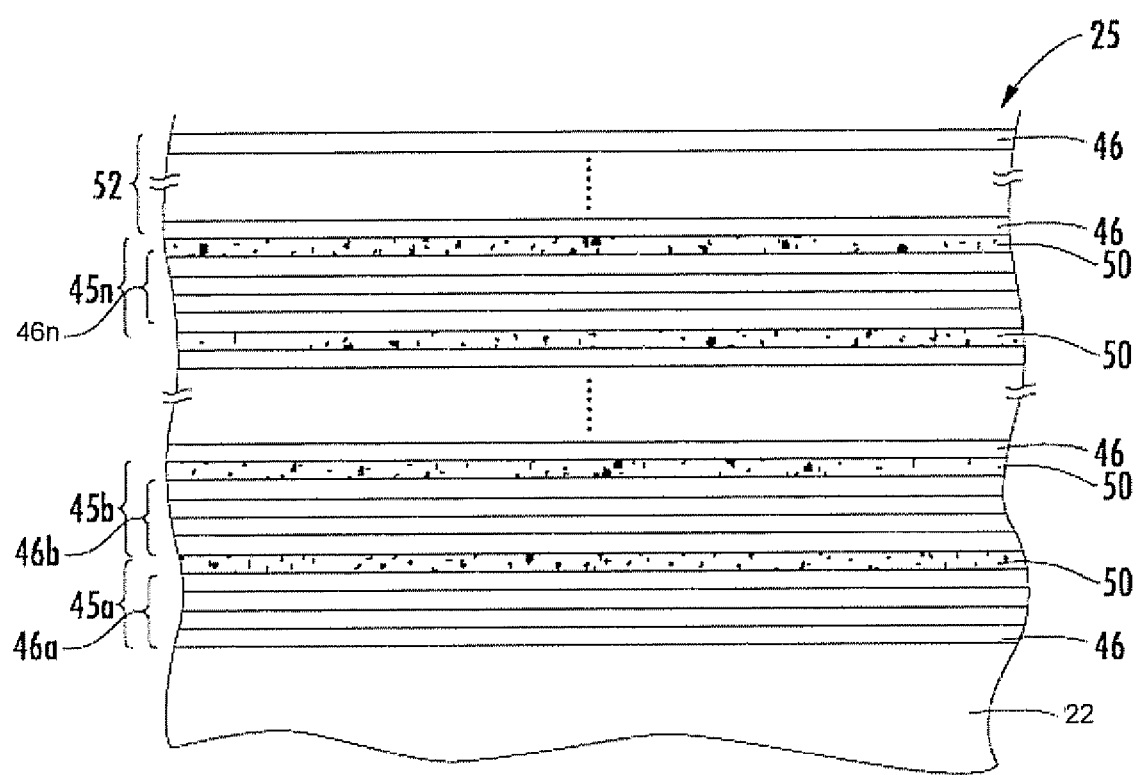
FIG. 5 is a greatly enlarged schematic cross-sectional view of the superlattice as shown in FIG. 2.
Figure 6:
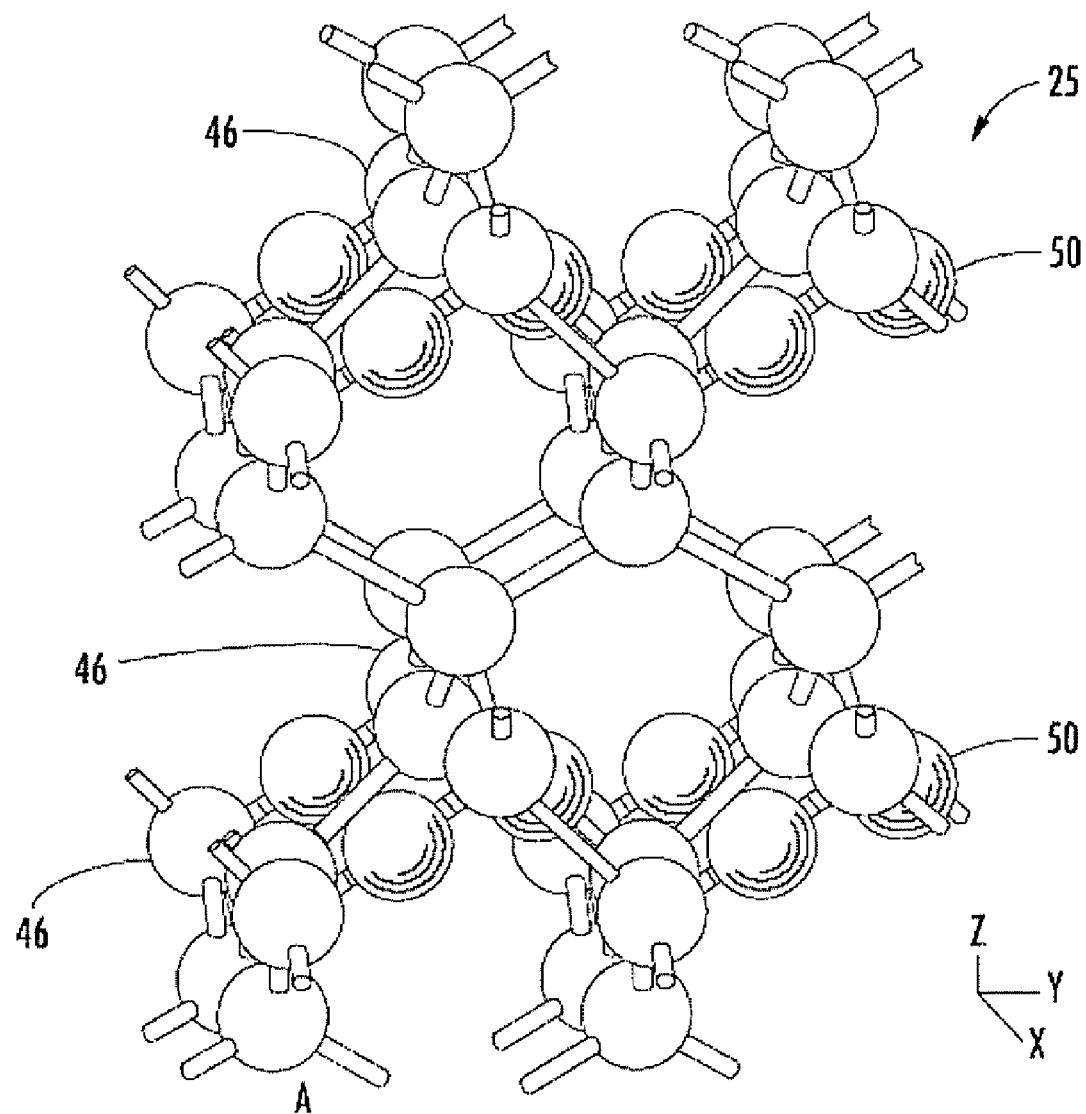
FIG. 6 is a perspective schematic atomic diagram of a portion of the superlattice shown in FIG. 2.

Referring now additionally to FIGS. 5 and 6, the materials or structures are in the form of a superlattice 25 whose structure is controlled at the atomic or molecular level and may be formed using known techniques of atomic or molecular layer deposition. The superlattice 25 includes a plurality of layer groups 45a–45n arranged in stacked relation, as noted above, as perhaps best understood with specific reference to the schematic cross-sectional view of FIG. 5.

Each group of layers 45a–45n of the superlattice 25 illustratively includes a plurality of stacked base semiconductor monolayers 46 defining a respective base semiconductor portion 46a–46n and an energy band-modifying layer 50 thereon. The energy band-modifying layers 50 are indicated by stippling in FIG. 5 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a–45n are chemically bound together. For example, in the case of silicon monolayers 46, some of the silicon atoms in the upper or top semiconductor monolayer of the group of monolayers 46a will be covalently bonded with silicon atoms in the lower or bottom monolayer of the group 46b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a–45n as some of the silicon atoms in each of these layers will be bonded to non-semiconductor atoms (i.e., oxygen in the present example), as will be appreciated by those skilled in the art.

In other embodiments, more than one non-semiconductor layer monolayer may be possible. By way of example, the number of non-semiconductor monolayers in the energy band-modifying layer 50 may preferably be less than about five monolayers to thereby provide desired energy band-modifying properties.

It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a–46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice. Moreover, as noted above, this structure also advantageously provides a barrier to dopant and/or material bleed or diffusion between layers vertically above and below the superlattice 25.

It is also theorized that a semiconductor device, such as the illustrated FINFET 20, will enjoy a higher charge carrier mobility based upon the lower conductivity effective mass than would otherwise be present. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

A cap layer 52 is on an upper layer group 45n of the superlattice 25. The cap layer 52 may comprise a plurality of base semiconductor monolayers 46. The cap layer 52 may have between 2 to 100 monolayers of the base semiconductor, and, more preferably between 10 to 50 monolayers. Other thicknesses may be used as well.

Each base semiconductor portion 46a–46n may comprise a base semiconductor selected from the group consisting of Group IV semiconductors, Group III–V semiconductors, and Group II–VI semiconductors. Of course, the term Group IV semiconductors also includes Group IV—IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing, as will be appreciated by those skilled in the art.

It should be noted that the term "monolayer" is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 5 and 6, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers, as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art. It may be especially appropriate to dope some portion of the superlattice 25 if the superlattice is to provide a portion of the channel, for example. In other embodiments, it may be preferably to have one or more groups of layers 45 of the superlattice 25 substantially undoped.

Figure 7:
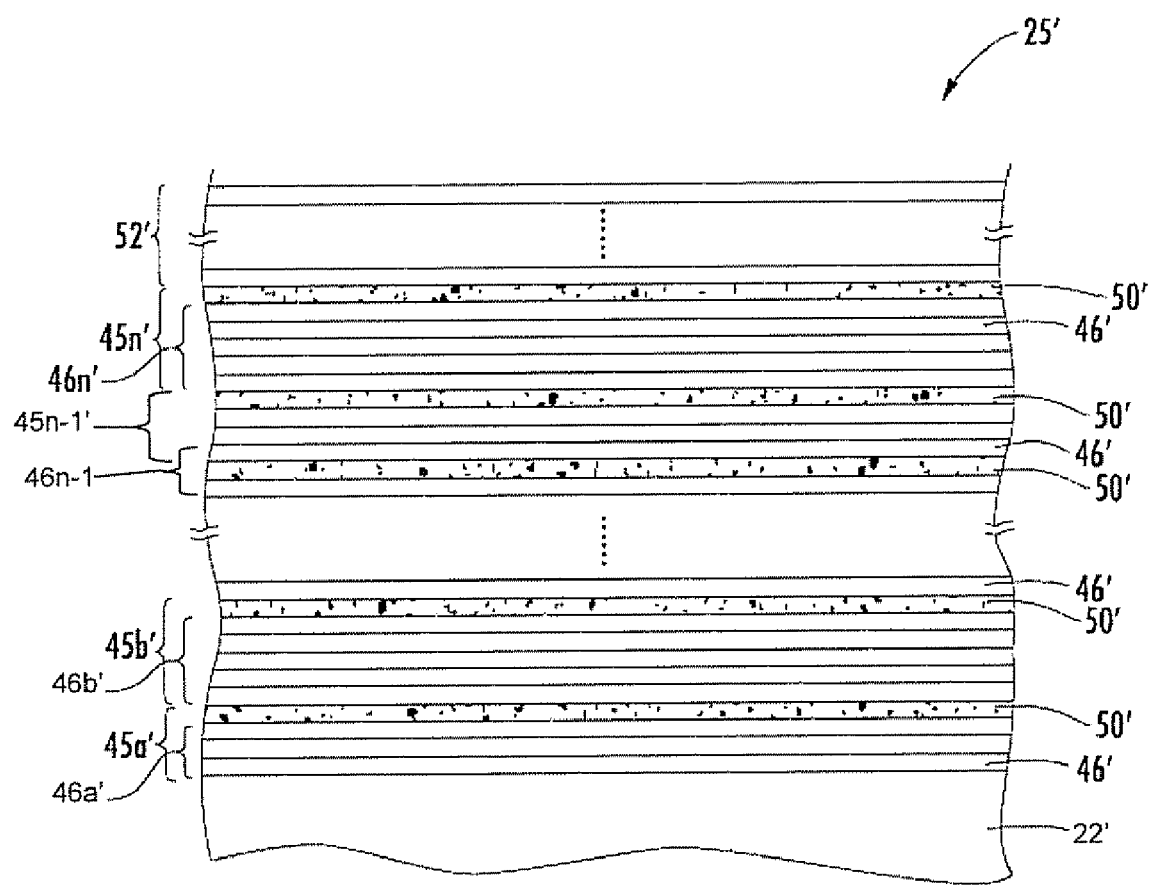
FIG. 7 is a greatly enlarged schematic cross-sectional view of another embodiment of a superlattice that may be used in the device of FIG. 2.

Referring now additionally to FIG. 7, another embodiment of a superlattice 25' in accordance with the invention having different properties is now described In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 7 not specifically mentioned are similar to those discussed above with reference to FIG. 6 and need no further discussion herein.

In some device embodiments, all of the base semiconductor portions 46a–46n of a superlattice 25 may be a same number of monolayers thick. In other embodiments, at least some of the base semiconductor portions 46a–46n may be a different number of monolayers thick. In still other embodiments, all of the base semiconductor portions 46a–46n may be a different number of monolayers thick.

Figure 8A:
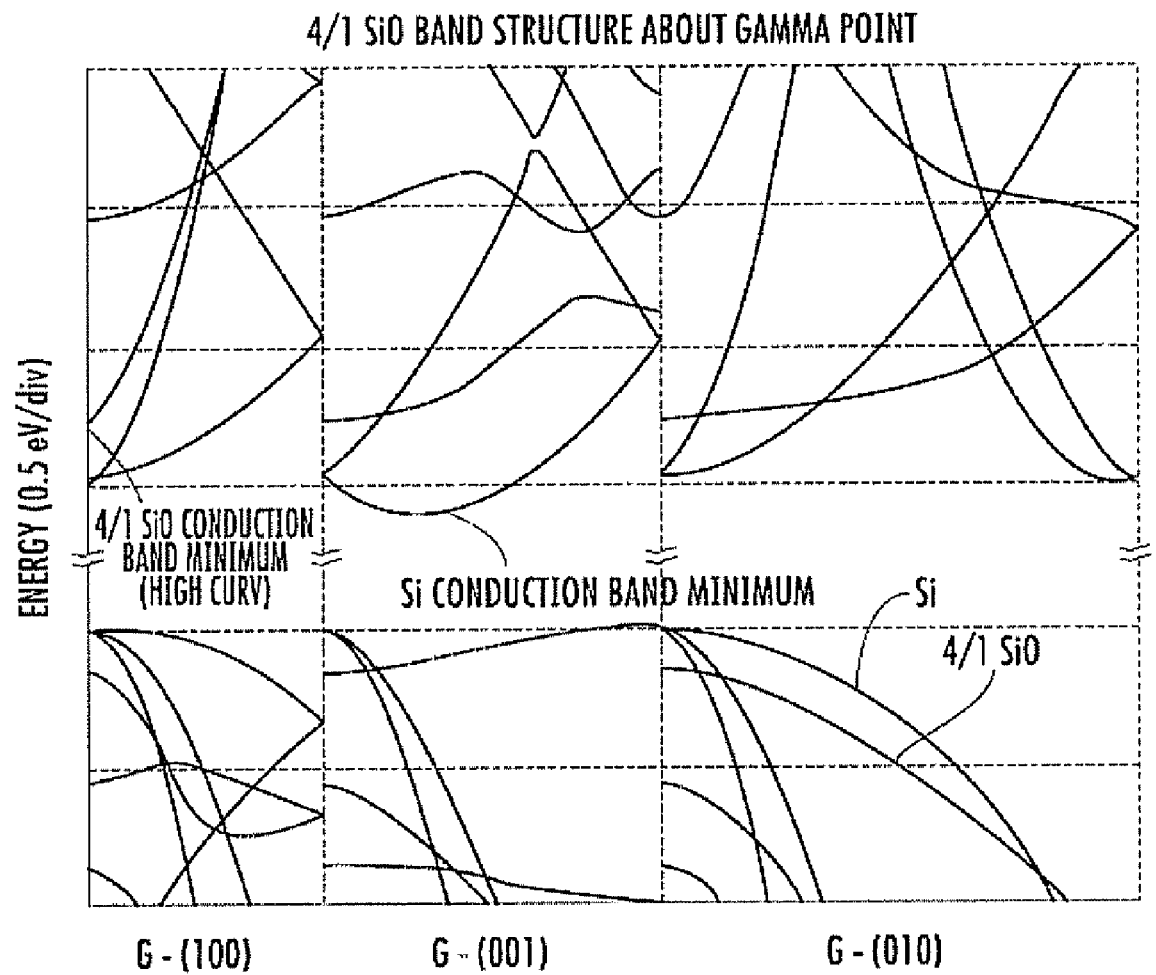
FIG. 8A is a graph of the calculated band structure from the gamma point (G) for both bulk silicon as in the prior art, and for the 4/1 Si/O superlattice as shown in FIGS. 2, 5, and 6.
Figure 8B:
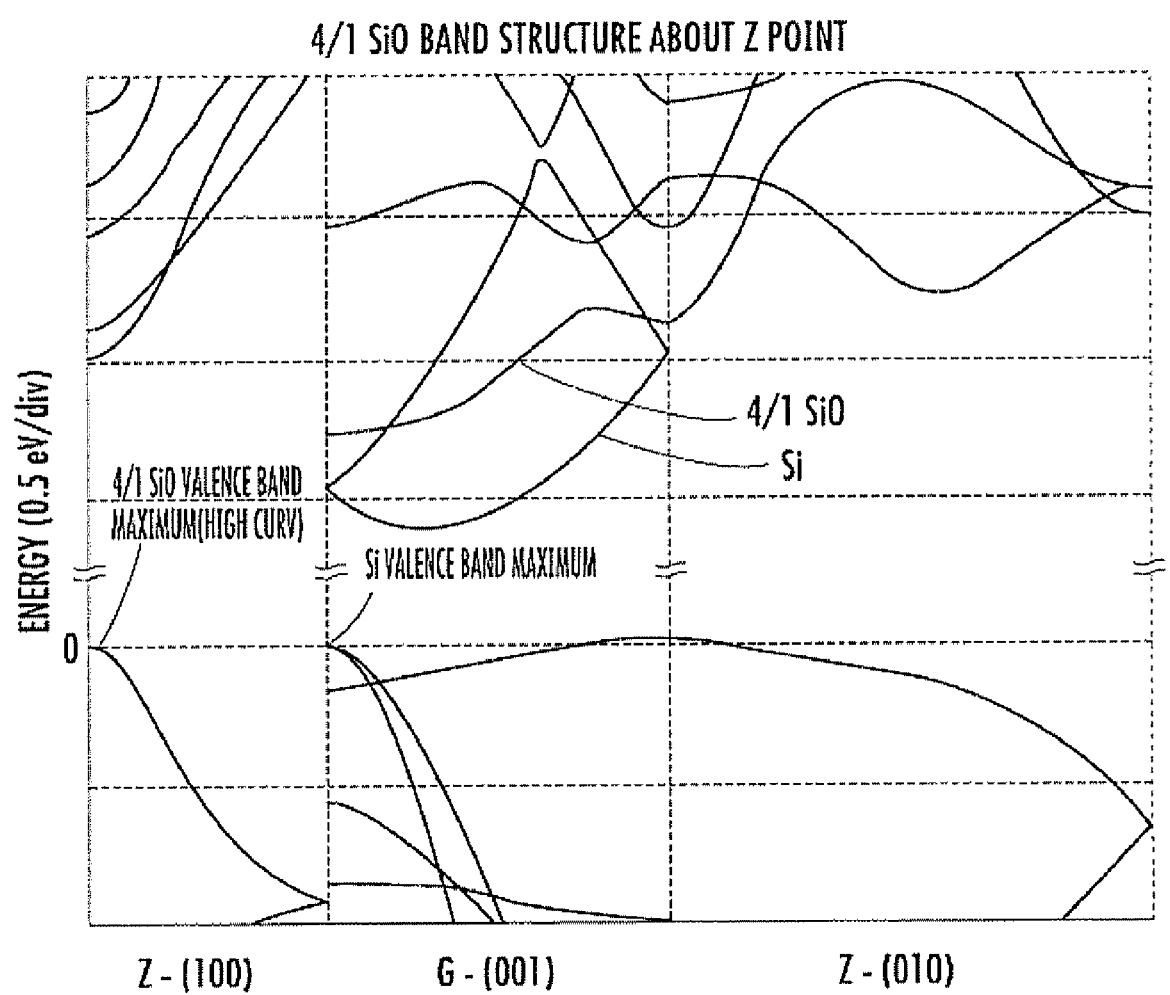
FIG. 8B is a graph of the calculated band structure from the Z point for both bulk silicon as in the prior art, and for the 4/1 Si/O superlattice as shown in FIGS. 2, 5, and 6.
Figure 8C:
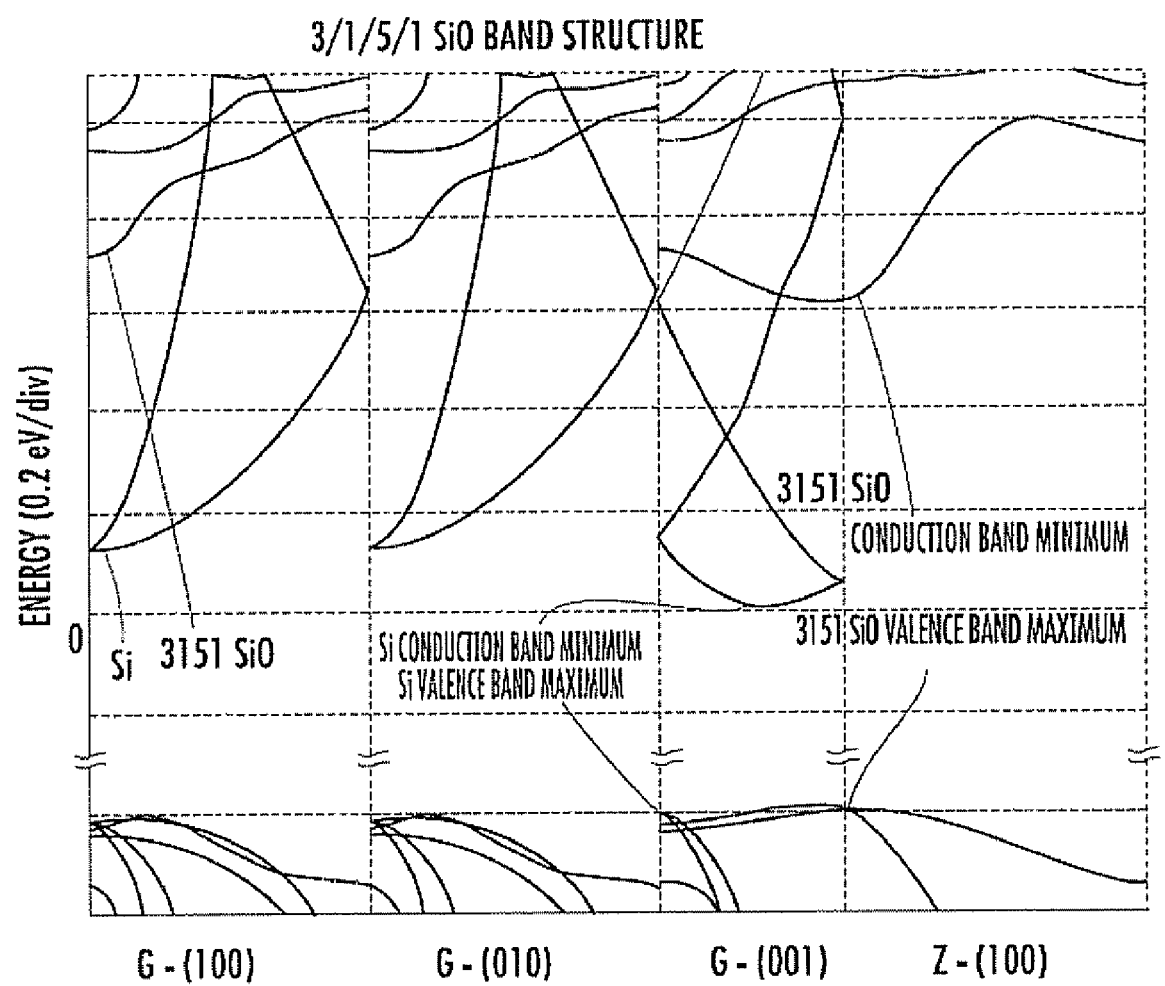
FIG. 8C is a graph of the calculated band structure from both the gamma and Z points for both bulk silicon as in the prior art, and for the 5/1/3/1 Si/O superlattice as shown in FIG. 7.

In FIGS. 8A–8C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 8A shows the calculated band structure from the gamma point (G) for both bulk silicon (represented by continuous lines) and for the 4/1 Si/O superlattice 25 as shown in FIG. 5 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (–110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 8B shows the calculated band structure from the Z point for both bulk silicon (continuous lines) and for the 4/1 Si/O superlattice 25 (dotted lines) of FIG. 5. This figure illustrates the enhanced curvature of the valence band in the (100) direction.

FIG. 8C shows the calculated band structure from both the gamma and Z point for both bulk silicon (continuous lines) and for the 5/1/3/1 Si/O structure of the superlattice 25' of FIG. 7 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Referring now additionally to FIGS. 9A–9D, a method for making the FINFET 20 will now be described. The method begins with providing the silicon substrate 21 having the uppermost insulator layer 22 thereon. By way of example, the substrate may be an eight-inch wafer 21 of lightly doped P-type or N-type single crystal silicon with (100) orientation, although other suitable substrates may also be used, and the insulator layer 22 may be a silicon dioxide layer having a thickness of about 150 to 300 nm. Moreover, a single crystal silicon layer 90 is bonded to the uppermost insulator layer 22 as shown and has a thickness of about 2.0 to 12 nm, for example. The silicon layer 90 may also have a (100) orientation, for example.

A cap or pad oxide layer 91 (e.g., silicon dioxide) is then formed on the top of the silicon layer 28. Next, the silicon layer 90 is patterned to form the semiconductor (i.e., silicon) layer 28, which defines the shape of the fin 23, and the source/drain extensions 26, 27. This patterning may be accomplished using a sidewall image transfer (SIT) technique, such as the one described in the IBM Tech Disclosure Bulletin entitled Method for Making Submicron Dimensions in Structures Using Sidewall Image Transfer Techniques by Johnson et al., 1984, which is hereby incorporated herein in its entirety by reference. Essentially, this technique involves patterning a dummy mandrel in silicon, followed by silicon nitride deposition and anisotropic etching to form silicon nitride spacers. The silicon mandrel is then etched off to leave a silicon nitride spacer 92, which is subsequently used as the hard mask to etch fins in the underlying silicon 90. It should be noted that in some embodiments the insulator layer 22 need not be used, and the substrate 21 may be patterned to form the silicon layer 28, as will be appreciated by those skilled in the art.

Figure 9A:
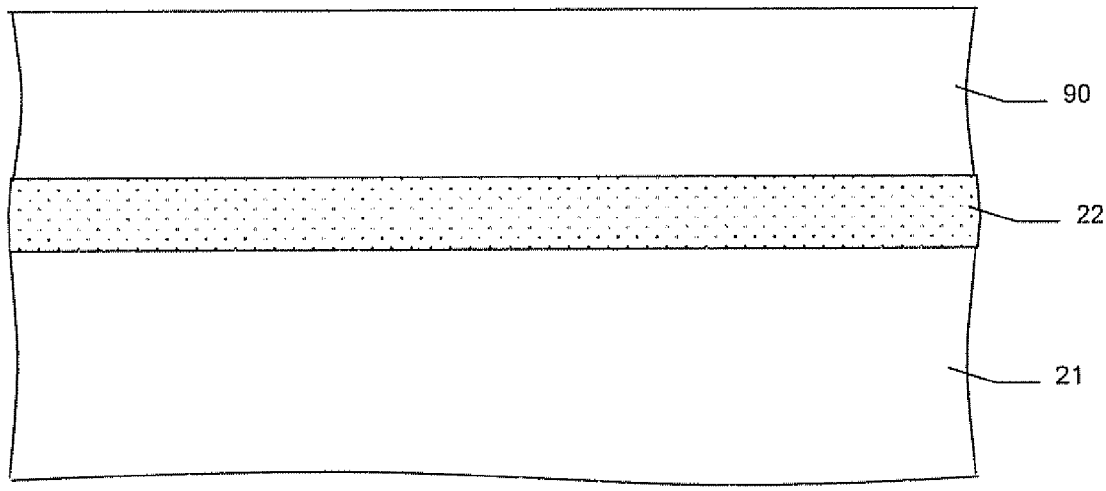
FIGS. 9A–9D are a series of schematic cross-sectional diagrams illustrating a method for making the semiconductor device of FIG. 1.
Figure 9B:
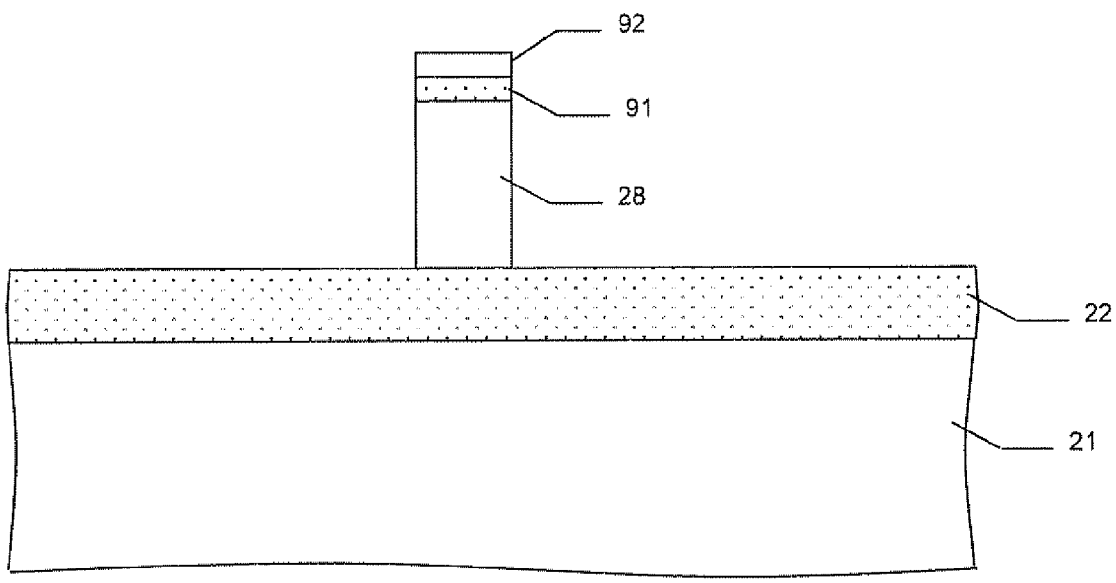
Figure 9C:
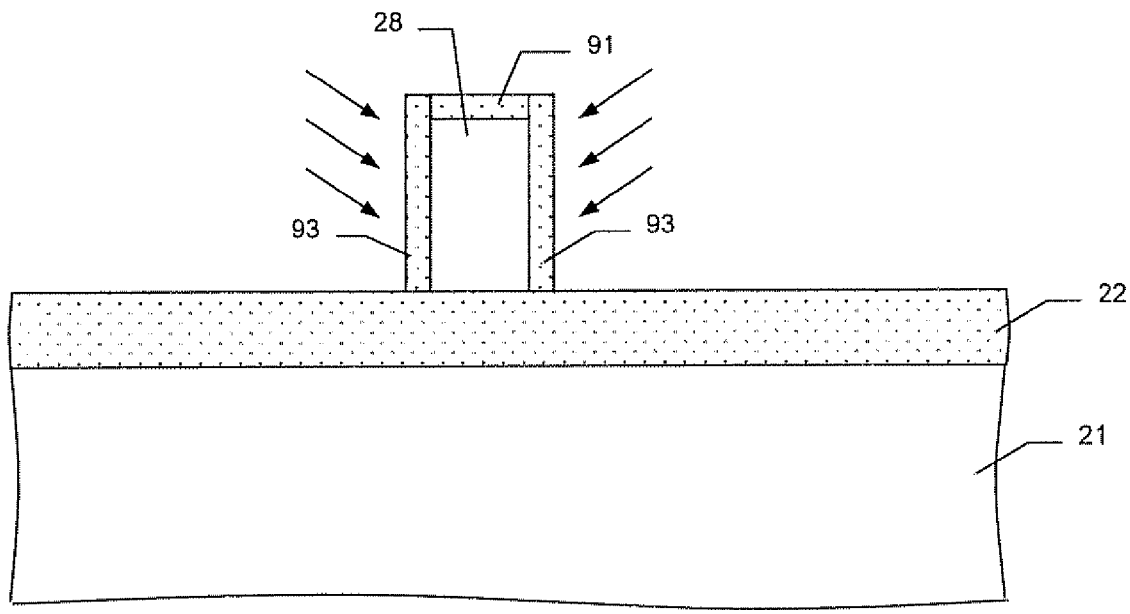
Figure 9D:
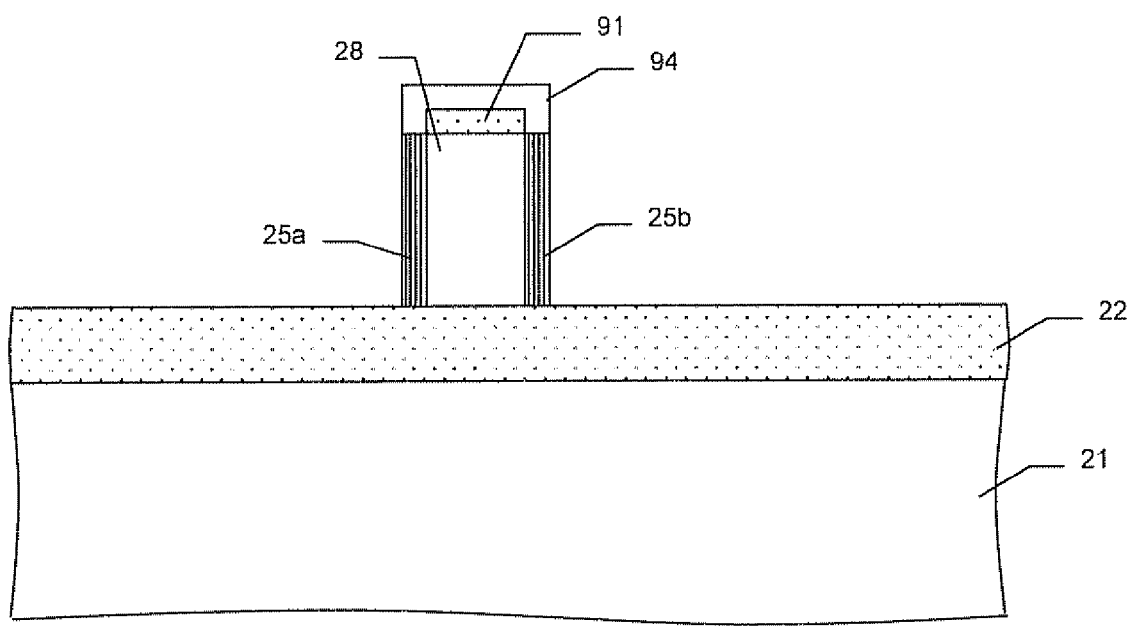

Turning now to FIG. 9C, sacrificial oxide 93 is grown on the sidewalls to a thickness of about 10 nm, for example, to remove plasma damage, and the nitride hard-mask 92 is then stripped off. After this, tilted implants for threshold voltage ($V_T$) adjustment of the channel on the fin 23 sidewalls may be performed through the sacrificial oxide 93, as represented by the diagonal arrows in FIG. 9C. The sacrificial oxide 93 is then stripped off in dilute hydrofluoric acid, for example.

Next, the superlattices 25a and 25b are formed on the sidewalls of the silicon layer 28 (FIG. 9D), as discussed above. During the silicon monolayer formation, amorphous silicon 94 is formed on the oxide layer 91, which is subsequently etched away. It should be noted that for (100) wafers/silicon layers 28, the laterally stacked superlattices 25a, 25b will be (110) epitaxial, whereas for (110) wafers/silicon layers, the laterally stacked superlattices 25a, 25b will be (100) epitaxial, as will be understood by those skilled in the art. The thickness of superlattices 25a, 25b is chosen to be compatible with available space between fins where multiple FINFETs are used, taking into consideration the film thicknesses for the dielectric and the gate electrode. Furthermore, the gate dielectric (e.g., nitrided oxide) layer 37 is formed. An exemplary equivalent oxide thickness of 1 to 2.5 nm may be used, for example. Other suitable dielectrics or high-K dielectric materials may also be used. The gate electrode layer 36 is formed over the gate dielectric layer 37. Exemplary gate electrode materials include amorphous or polysilicon, or Si—Ge, although metal gates may be used as well. The gate electrode layer 36 may then be doped as desired, although this is not necessary for metal gates, and the gate may be patterned.

The source/drain extension 26, 27 may then be implanted, and the nitride (e.g., SiN) spacers 38, 39 and 40, 41 are formed using CVD and a blanket anisotropic etch, as will be appreciated by those skilled in the art. Next, the silicide layer 34 is formed on the gate electrode layer 36 and the source and drain extensions 26, 27 to complete the device illustrated in FIG. 1. Exemplary silicides may include $TiSi_2$, $CoSi_2$ or $NiSi$. Metal gates do not require silicide. Other processing steps, such as silicon dioxide deposition (TEOS or plasma oxide), contact and tungsten plug formation, and back-end processing using either aluminum-based or copper metallization may also be performed, as will also be appreciated by those skilled in the art.

Figure 10A:
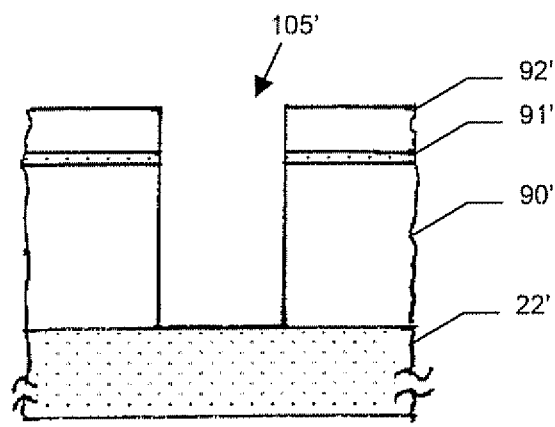
FIGS. 10A–10F are a series of schematic cross-sectional diagrams illustrating a method for making pairs of spaced-apart superlattice fins for the FINFET of FIG. 1.
Figure 10B:
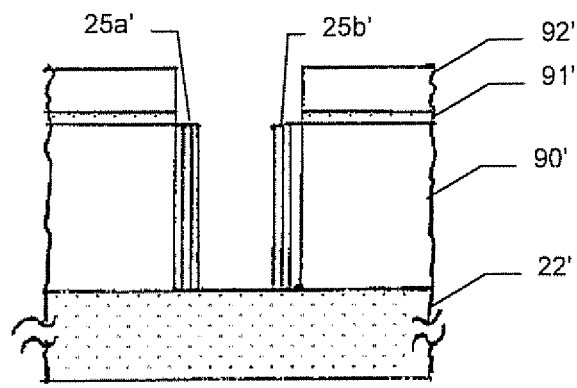

An alternate method for forming the spaced apart superlattices 25a', 25b40 is now described with reference to FIGS. 10A–10F. Here again, a silicon-on-insulator (SOI) configuration including the insulator layer 22' and silicon layer 90' thereon is used, and the cap oxide layer 91' and a nitride (e.g., silicon nitride) layer 92' are formed thereon as discussed above with reference to FIG. 9A. However, a photomask is then used for etching a trench 105' down to the insulator layer 22' (FIG. 10A). The pair of superlattices 25a', 25b40 are then formed as discussed above on opposing sidewalls of the trench 105' as shown in FIG. 10B.

Figure 10C:
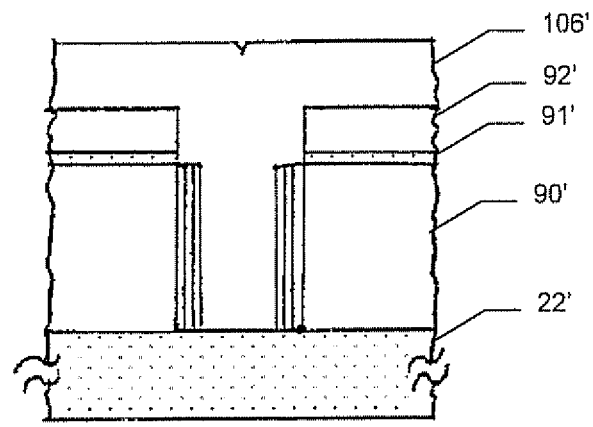
Figure 10D:
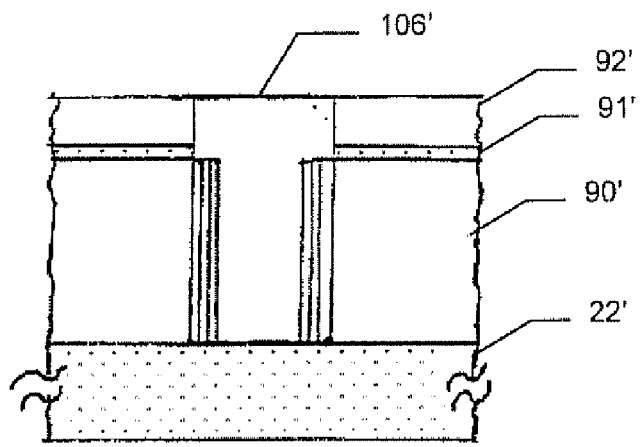
Figure 10E:
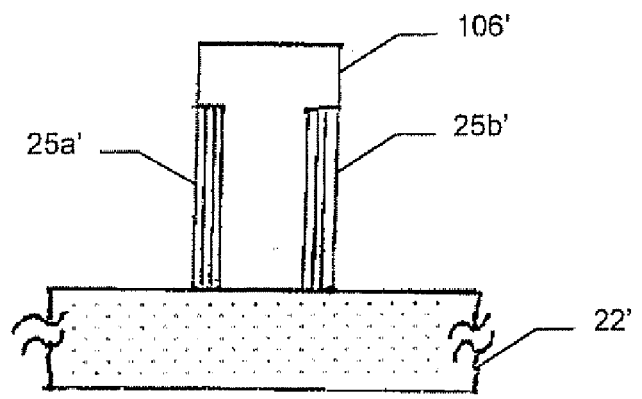
Figure 10F:
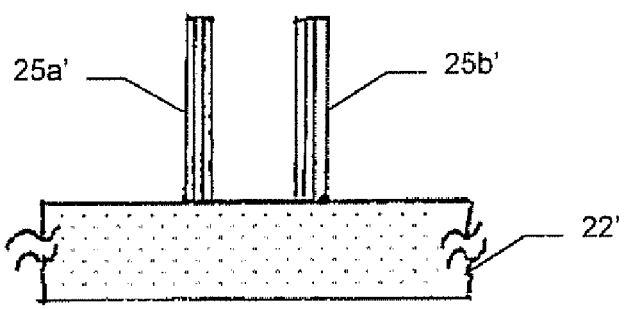

Next, the trench 105' is filled with an insulator 106', as seen in FIG. 10C. Other fillers may also be used, such as a dielectric sandwich or a sandwich of other materials, as will be appreciate by those skilled in the art. The insulator 106' is then planarized to the top of the nitride layer 92' (FIG. 10D), which is followed by etching of the nitride layer, the cap oxide layer 91', and the silicon layer 90' leaving only the superlattices 25a', 25b' and the insulator therebetween (FIG. 10E). The remainder of the insulator 106' between the superlattices 25a', 25b' is then etched away (FIG. 10F), and the FINFET 20 illustrated in FIG. 1 may then be formed as described as described above using the freestanding superlattices.

Figure 11A:
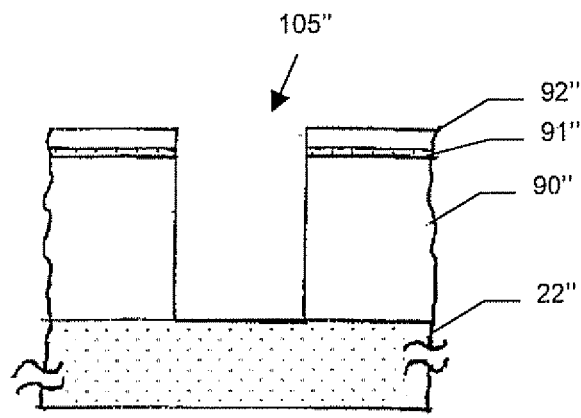
FIGS. 11A–11F are a series of schematic cross-sectional diagrams illustrating a method for making pairs of spaced-apart superlattice fins for the FINFET of FIG. 1.
Figure 11B:
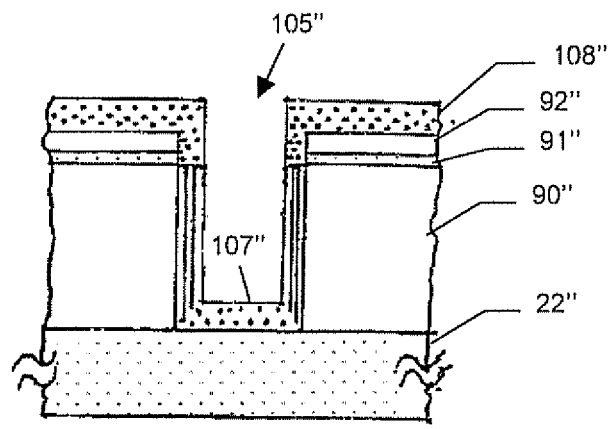
Figure 11C:
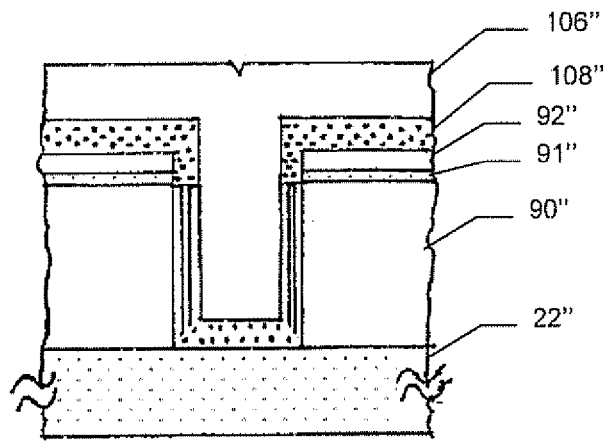
Figure 11D:
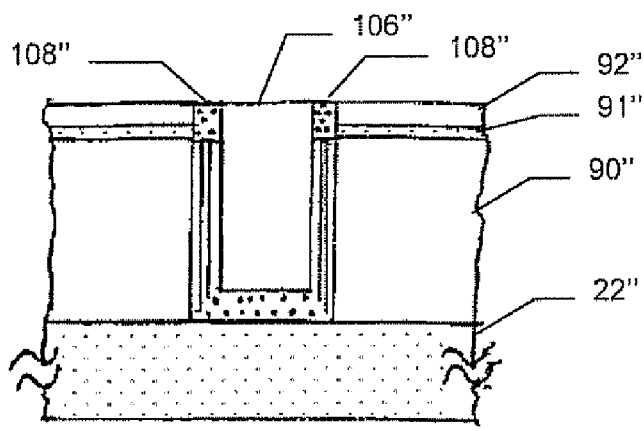

Yet another alternate method for forming the spaced apart superlattices 25a", 25b" is now described with reference to FIGS. 11A–11F. Here again, the cap oxide layer 91" and nitride layer 92" are formed on the semiconductor layer 90", and a trench 105" is formed therein (FIG. 11A). However, the various layers of the superlattice structure are then formed on the bottom and sides of the trench 105", as well as on the nitride layer 92". This will result in crystalline silicon superlattice layers 25a", 25b" on the sidewalls of the trench 105", while the remaining silicon layer growth 107", 108" on the bottom of the trench and on the nitride layer 92", respectively, will be poly crystalline (shown with large stippling dots in FIG. 11B).

Figure 11E:
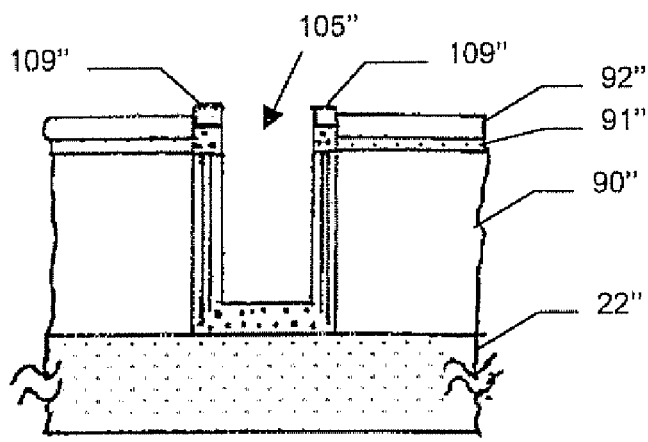
Figure 11F:
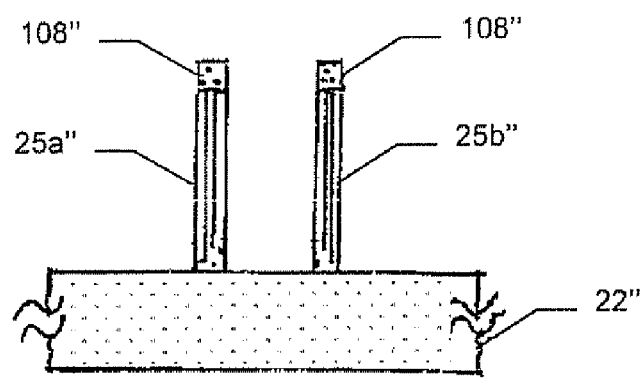

The trench 105" is then filled with the insulator 106" (FIG. 11C) and planarized to the top of the nitride layer 92' (FIG. 11D), as discussed above. A portion of the poly crystalline silicon layer growth 108" is then etched away (FIG. 11E). The remaining poly crystalline silicon layer growth 108" is then oxidized so that $SiO_2$ regions 109" are formed thereon, and the nitride layer 92" and cap oxide 91" are etched away. Thereafter, the regions 109" are removed and the insulator 106" is etched away, as is the poly crystalline superlattice layer growth 107" at the bottom of the trench 105". The result is the free standing spaced apart superlattices 25a", 25b" with poly crystalline silicon layer growth 108" on the top thereof, which may then be used as the starting point for making the FINFET 20 of FIG. 1.

It should be noted that certain of the above-described steps may be performed in different orders, as will be appreciated by those skilled in the art. By way of example, the poly crystalline silicon layer growth 107" may be etched away from the bottom of the trench 105" prior to depositing the dielectric 106", for example.

Figure 4:
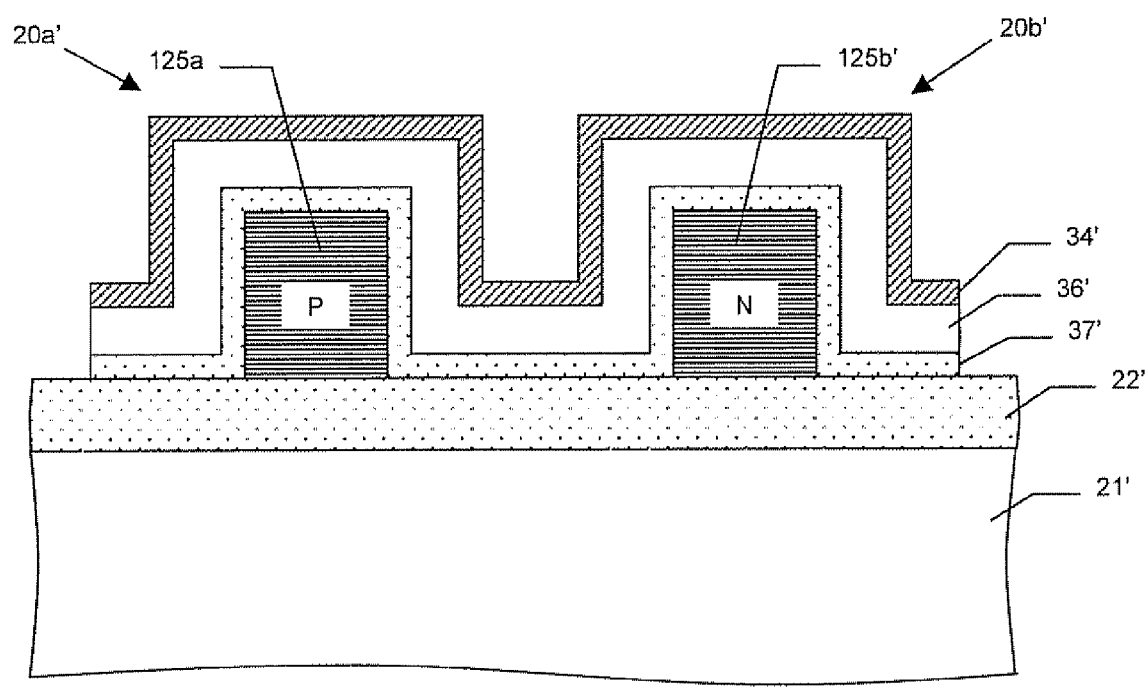
FIG. 4 is a schematic cross-sectional diagram of an alternate embodiment of the semiconductor device of FIG. 2.
Figure 12A:
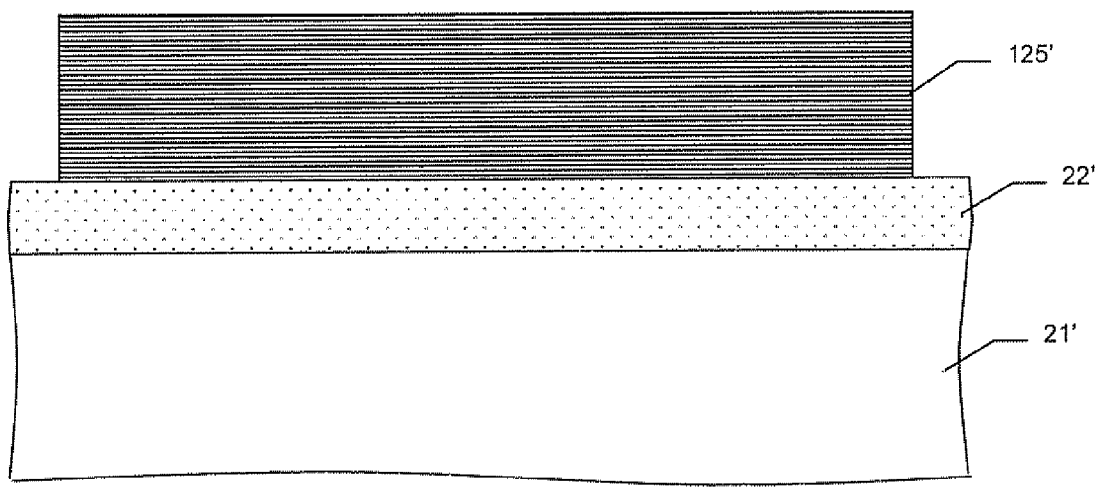
FIGS. 12A–12B are a series of schematic cross-sectional diagrams illustrating a method for making the semiconductor device of FIG. 4.
Figure 12B:
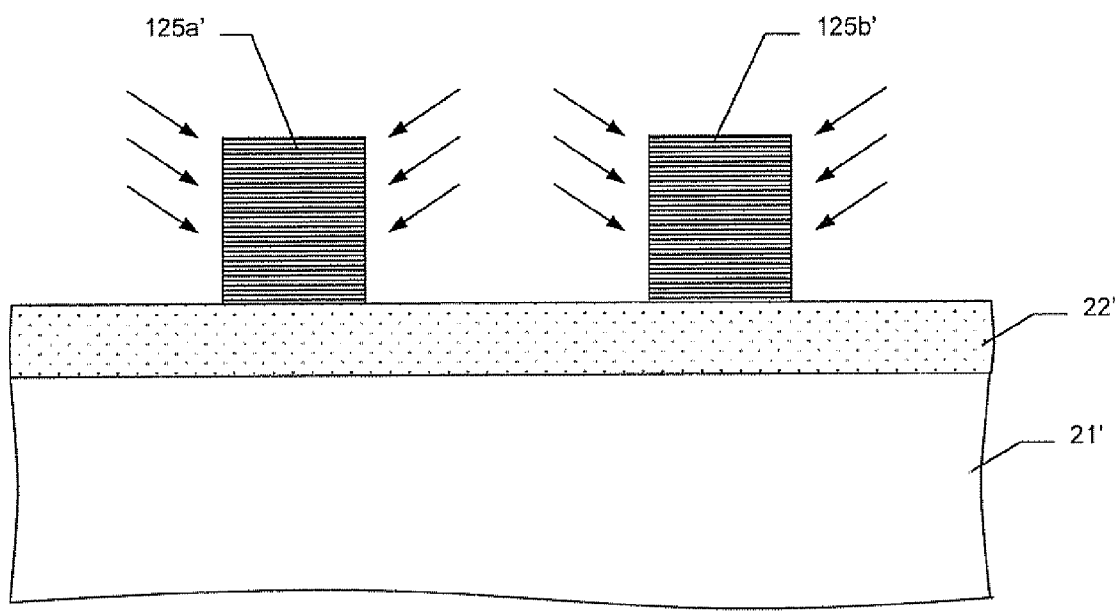
Figure 13:
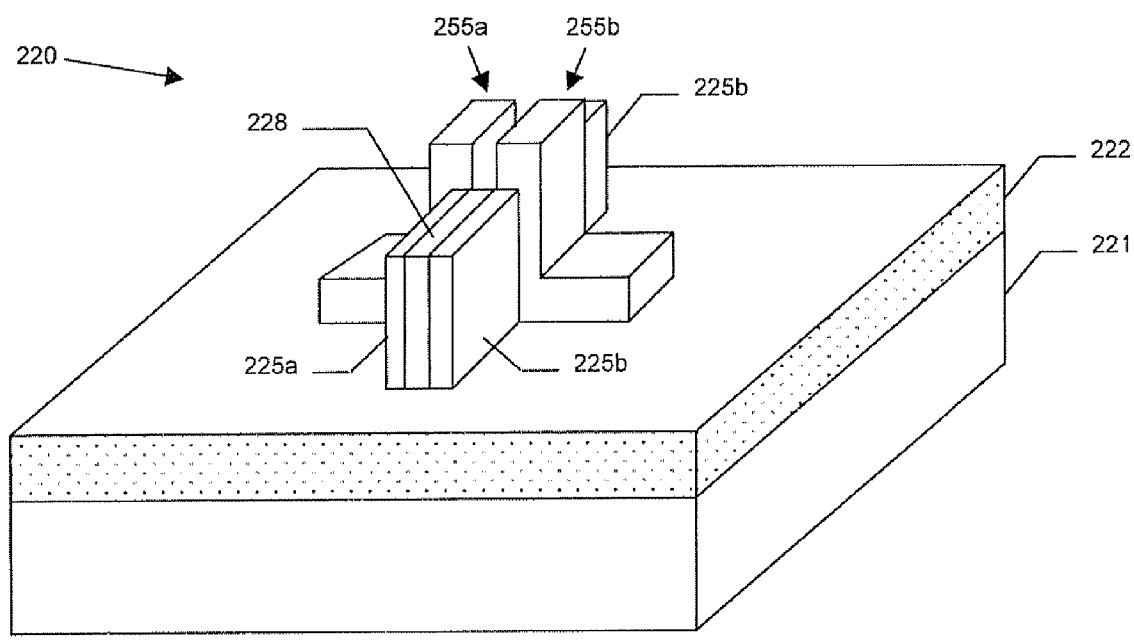
FIGS. 13–14 are perspective views of CMOS FINFET devices in accordance with the present invention.

Turning now additionally to FIGS. 12A and 12B, a method for making the FINFETs 20a', 20b' illustrated in FIG. 4 is now described Rather than beginning with the silicon layer 90' as described above, a superlattice layer 125''' is formed on a separate substrate (not shown) and bonded to the upper dielectric layer 22''' as shown. The superlattice layer 125''' is then patterned/etched to form the vertically stacked superlattices 125a''', 125b''' and respectively doped with P and N-type dopants, as shown with diagonal arrows in FIG. 12B.

The superlattice layer 125''' may be etched using known semiconductor processing techniques. However, it should be noted that with the non-semiconductor present in the superlattice 125''', e.g., oxygen, the superlattice may be more easily etched using an etchant formulated for oxides rather than silicon. Of course, the appropriate etch for a given implementation will vary based upon the structure and materials used for the superlattice 125''', as will be appreciated by those of skill in the art. The remaining processing steps for forming the FINFETs 20a', 20b' (i.e., gate and silicide formation, etc.) are similar to those discussed above and therefore require no further discussion herein.

It will therefore be appreciated by those skilled in the art that the high-mobility superlattice 25 may be used in FINFET devices in accordance with the present invention to advantageously enhance carrier mobility in the channel, while providing a transistor configuration that is well-suited for relatively low power and high performance applications. Moreover, to provide desired mobility enhancement of the superlattice 25 for both PMOS and NMOS FINFETs for a (100) wafer surface, PMOS FINFETs may be located parallel and perpendicular to the (110) orientation flat, whereas NMOS FINFETs may be rotated 45 degrees from the orientation flat, as will be appreciated by those skilled in the art.

The foregoing is, of course, but one example of a process and device in which the present invention may be used, and those of skill in the art will understand its application and use in many other processes and devices. In other processes and devices the structures of the present invention may be formed on a portion of a wafer or across substantially all of a wafer. Additionally, an atomic layer deposition tool may also not be needed for forming the superlattice 25 in some embodiments, For example, the monolayers may be formed using a CVD tool with process conditions compatible with control of monolayers, as will be appreciated by those skilled in the art. Further details regarding fabrication of superlattices in accordance with the present invention may be found in the above-noted U.S. application Ser. No. 10/467,069, for example.

Figure 3:
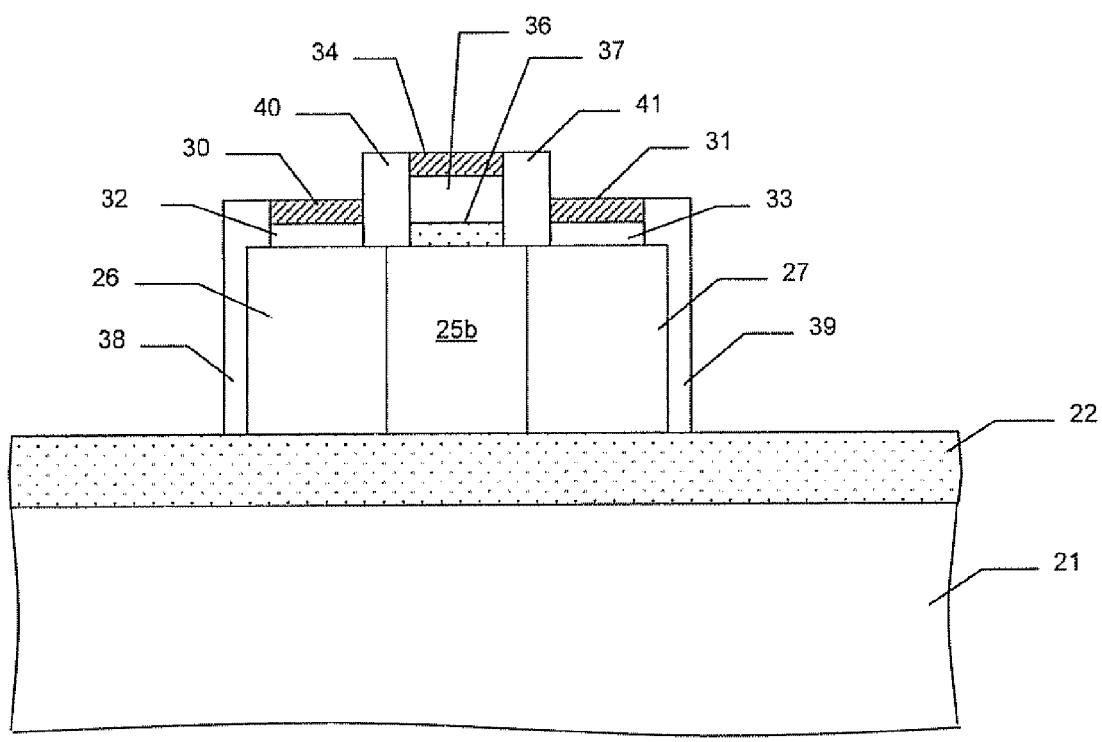
FIG. 3 is a schematic cross-sectional diagram of the semiconductor device of FIG. 1 taken along the line 3—3.

Still further embodiments of CMOS FINFET structures including one or more superlattices are now described with reference to FIGS. 13–16. In these figures, elements or regions similar to those in FIGS. 1–3 are indicated in increments of one hundred (e.g., the superlattice 25a corresponds to the superlattice 225a in FIG. 13, 325a in FIG. 14, and 425a in FIG. 15).

In the FINFET 220, the superlattices 225a, 225b extend laterally outward from the gate region to provide sources and drains for the FINFET. For example, the superlattice 225a may be doped with a p-type dopant in the gate region and an n-type dopant in the adjacent source and drain regions to provide a p-channel FET, while the superlattice 225b may be oppositely doped to provide the complementary n-channel device. The doping of the superlattices 225a, 225b is preferably a relatively shallow implant so that the center semiconductor layer 228 remains undoped and, therefore, provides an insulating barrier between the two superlattices. Doping may be performed, for example, by selectively implanting dopants from the side. That is, the dopant is implanted from one side of the FINFET 220, then the device may be rotated 180° and implanted from the other side so that only the selected portions of the given superlattice are doped, as will be appreciated by those skilled in the art.

In the illustrated embodiment, the gate region is formed in a similar fashion described above with reference to FIGS. 1–3. However, a trench is etched in the central portion of the gate structure to provide respective gates 255a, 255b for each of the n-channel and p-channel FETs, as opposed to the common gate structure described above. Moreover, in other embodiments separate source and drains need not be used. That is, the source or drain portions of the FINFET 220 may be electrically connected together by a source/drain contact to provide a common source or drain, as will be appreciated by those skilled in the art.

The FINFET 320 (FIG. 14) illustratively includes a different superlattice fin structure including a central semiconductor layer 328, insulating superlattice layers 325c, 325d on opposing sides of the semiconductor layer, and high mobility superlattice layers 325a, 325b laterally adjacent the insulating superlattice layers 325c, 325d, respectively, as shown. The insulating superlattice layers 325c, 325d are substantially undoped so that along with the non-semiconductor monolayers therein they provide an insulating barrier between the charge carriers that flow through the high mobility (i.e., doped) superlattice layers 325a, 325b, similar to the superlattice layers 225a, 225b in the illustrated FINFET 220. A common gate structure is shown in the illustrated embodiment, but separate gates may be used in some embodiments if desired.

Figure 14:
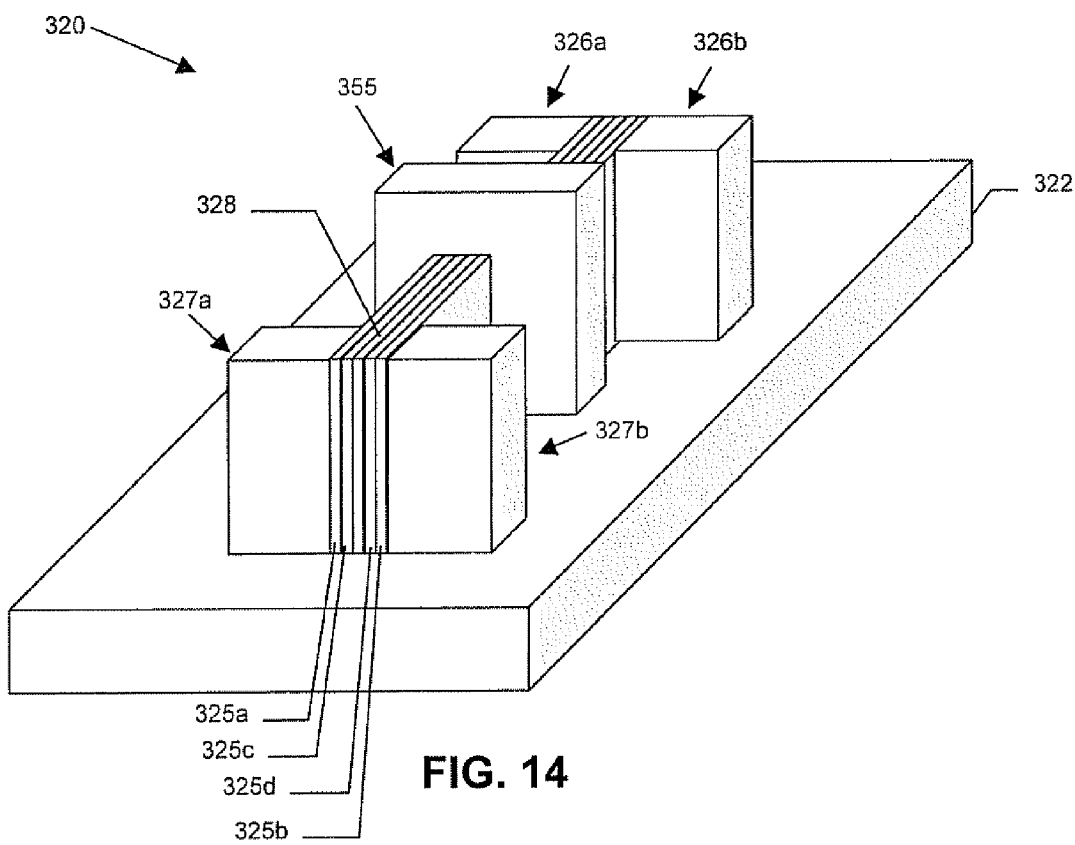
Figure 15A:
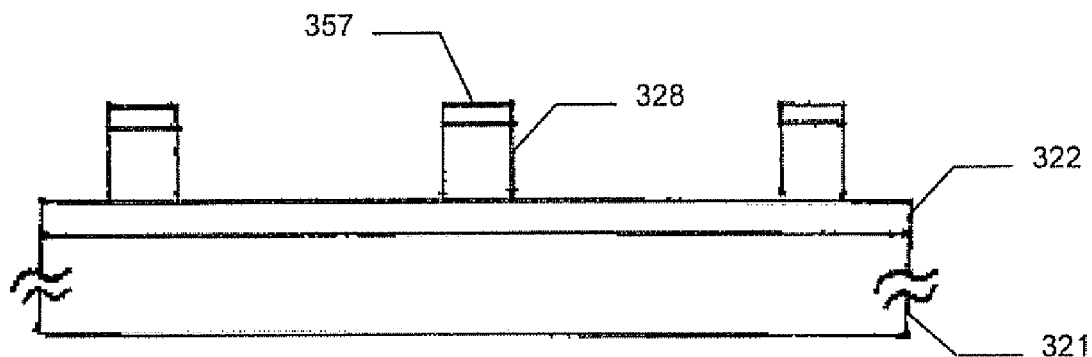
FIGS. 15A–15E are a series of schematic cross-sectional sectional diagrams illustrating a method for making the fin structure of the FINFET of FIG. 14.
Figure 15B:
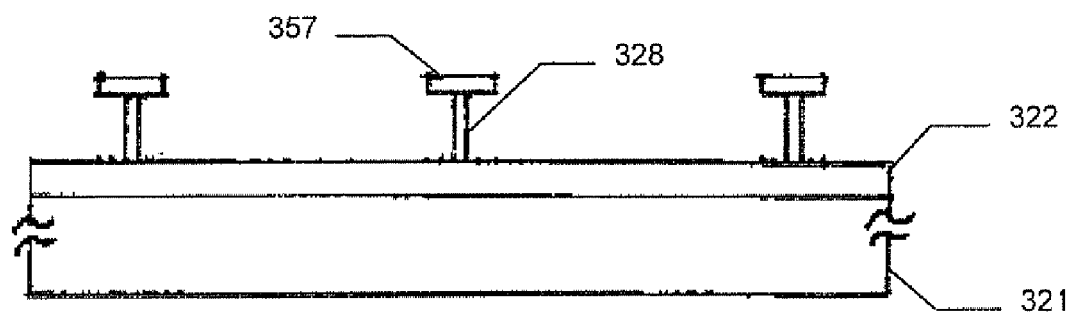
Figure 15C:
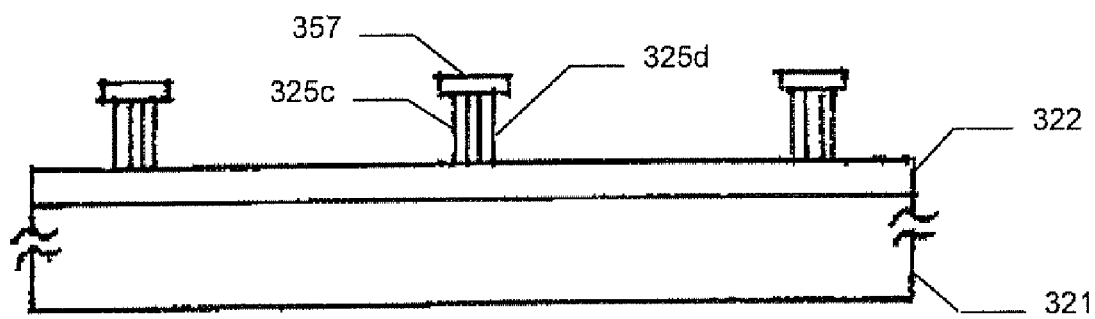
Figure 15D:
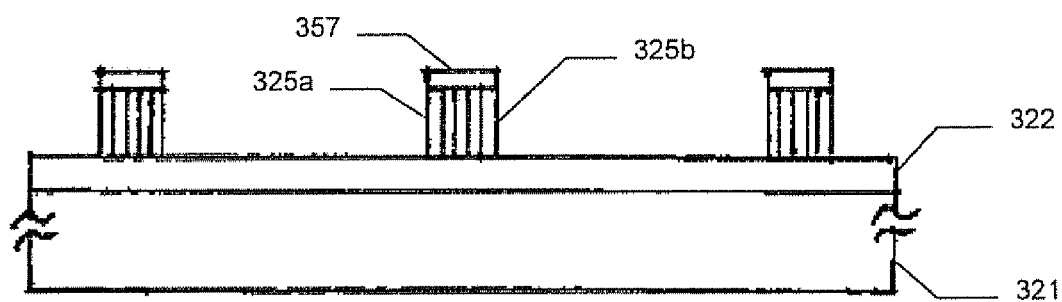

Method steps for forming the fin structure illustrated in FIG. 14 are now described with reference to FIGS. 15a–15e. Beginning with a standard SOI wafer, a protective layer 357 of silicon dioxide, silicon nitride, or a similar layer or "sandwich" is formed, masked, and etched to provide the silicon pillars as shown in FIG. 15a. Next, silicon is etched from the unprotected area on the sides of the pillars using an anisotropic etch (FIG. 15b). Additional silicon may also be etched from the exposed areas using an isotropic etch in some embodiments, if desired, or an isotropic etch may be used exclusively, as will be appreciated by those skilled in the art.

Figure 15E:
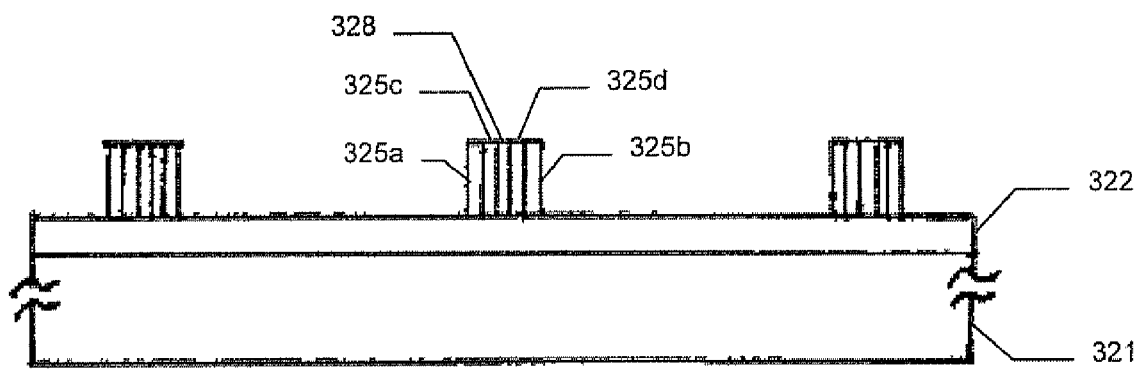
Figure 16:
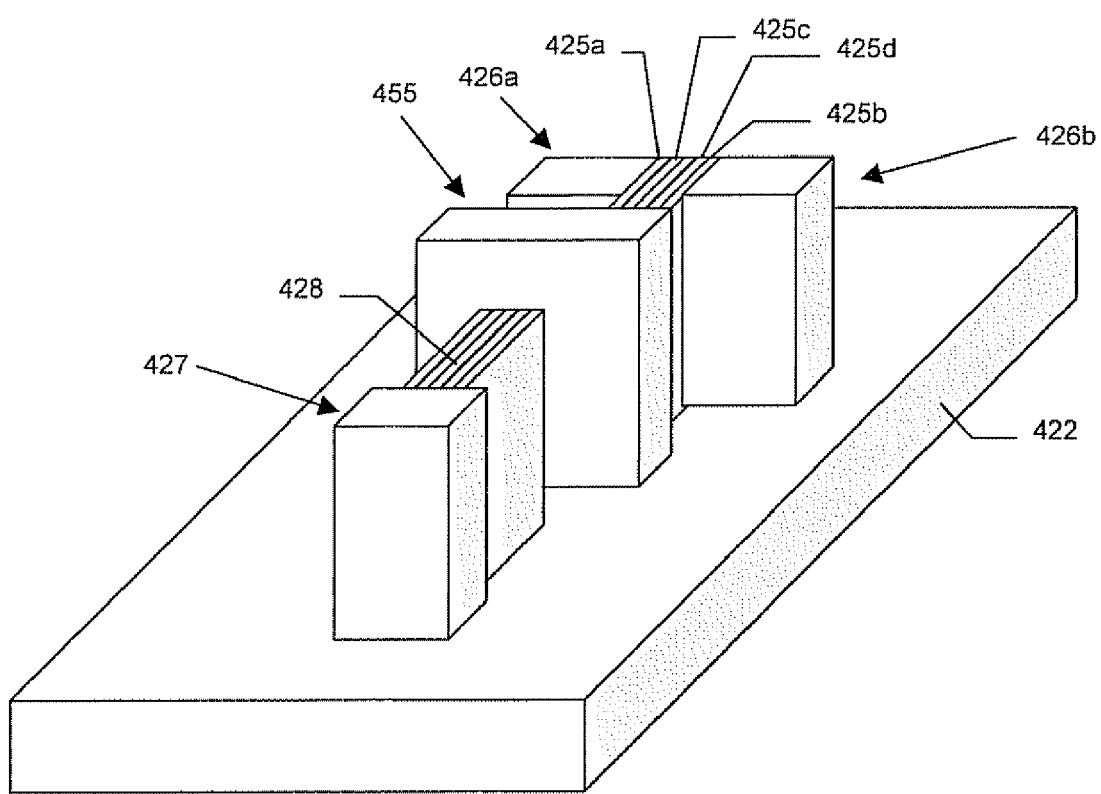
FIG. 16 is a perspective view of a CMOS FINFET inverter in accordance with the present invention.

The layers 325c, 325d of low-conductivity (i.e., insulating) superlattices are then selectively deposited on either side of the silicon pillar/layer 328 (FIG. 15c), as described above. Moreover, the high mobility superlattice layers 325a, 325b are then selectively deposited adjacent the insulating superlattice layers 325c, 325d (FIG. 15d), respectively, and doped accordingly. The protective layer 357 is then removed from the top of the fin (FIG. 15e).

In the FINFET 320, source regions 326a, 326b and drain regions 327a, 327b are formed laterally adjacent the high mobility superlattice layers 325a, 325b as shown. This configuration may advantageously be used to provide separate contacts so that the sources/drains do not short to one another. However, in the FINFET 420 illustrated in FIG. 16, a single (i.e., common) drain is instead used. This configuration advantageously provides a CMOS FINFET inverter, as will be appreciated by those skilled in the art. This FINFET configuration may be particularly advantageous in that if n-only and/or p-only devices are also desired on a same chip with the inverters, the appropriate contact for the source 426a or 426b of the selected devices may be omitted to provide n-channel or p-channel devices, as will also be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   at least one fin field-effect transistor (FINFET) comprising a fin, source and drain regions adjacent opposite ends of said fin, and a gate overlying said fin;
   said fin comprising at least one superlattice including a plurality of stacked groups of layers, each group of layers comprising a plurality of stacked base semiconductor monolayers defining a base semiconductor portion and at least one non-semiconductor monolayer constrained within a crystal lattice of adjacent base semiconductor portions.

2. The semiconductor device of claim 1 further comprising a substrate supporting said at least one FINFET; and wherein said fin comprises a pair of spaced apart superlattices and a semiconductor layer therebetween with groups of layers of each superlattice being stacked in a lateral direction.

3. The semiconductor device of claim 1 further comprising a substrate supporting said at least one FINFET; and wherein said fin comprises a single superlattice with groups of layers stacked in a vertical direction.

4. The semiconductor device of claim 1 wherein said substrate comprises an uppermost insulator layer supporting said at least one FINFET.

5. The semiconductor device of claim 1 wherein said gate comprises a gate dielectric layer and a gate electrode layer overlying said gate dielectric layer.

6. The semiconductor device of claim 1 wherein at least one group of layers of said at least one superlattice is substantially undoped.

7. The semiconductor device of claim 1 wherein said base semiconductor comprises silicon.

8. The semiconductor device of claim 7 wherein said at least one non-semiconductor monolayer comprises oxygen.

9. The semiconductor device of claim 1 wherein said at least one non-semiconductor monolayer comprises a non-semiconductor selected from the group consisting essentially of oxygen, nitrogen, fluorine, and carbon-oxygen.

10. The semiconductor device of claim 1 wherein said at least one non-semiconductor monolayer is a single monolayer thick.

11. The semiconductor device of claim 1 wherein all of said base semiconductor portions are a same number of monolayers thick.

12. The semiconductor device of claim 1 wherein at least some of said base semiconductor portions are a different number of monolayers thick.

13. The semiconductor device of claim 1 wherein opposing base semiconductor portions in adjacent groups of layers of said at least one superlattice are chemically bound together.

14. The semiconductor device of claim 1 wherein said at least one FINFET comprises a plurality of FINFETS.

15. The semiconductor device of claim 14 wherein said plurality of FINFETS have different channel conductivities.

16. The semiconductor device of claim 1 wherein said at least one FINFET comprises at least one n-channel FINFET and at least one p-channel FINFET.

17. The semiconductor device of claim 1 wherein said at least one FINFET comprises a plurality thereof defining an inverter.

18. A semiconductor device comprising:

a substrate; and at least one fin field-effect transistor (FINFET) supported by said substrate and comprising a fin, source and drain regions adjacent opposite ends of said fin, and a gate overlying said fin;

said fin comprising a pair of spaced apart superlattices and a semiconductor layer therebetween;

each superlattice comprising a plurality of groups of layers stacked in a lateral direction, each group of layers comprising a plurality of stacked base silicon monolayers defining a base silicon portion and at least one oxygen monolayer constrained within a crystal lattice of adjacent base silicon portions.

19. The semiconductor device of claim 18 wherein said substrate comprises an uppermost insulator layer supporting said at least one FINFET.

20. The semiconductor device of claim 18 wherein said at least one FINFET comprises a plurality of FINFETS having different channel conductivities.

21. A semiconductor device comprising:

a substrate; and at least one fin field-effect transistor (FINFET) comprising a fin, source and drain regions adjacent opposite ends of said fin, and a gate overlying said fin;

said fin comprising a superlattice including a plurality of groups of layers stacked in a vertical direction, each group of layers comprising a plurality of stacked base silicon monolayers defining a base silicon portion and at least one oxygen monolayer constrained within a crystal lattice of adjacent base silicon portions.

22. The semiconductor device of claim 21 wherein said substrate comprises an uppermost dielectric layer supporting said at least one FINFET.

23. The semiconductor device of claim 21 wherein said at least one FINFET comprises a plurality of FINFETS having different channel conductivities.

* * * * *

UNITED STATES PATENT AND TRADEMARK OFFICE
CERTIFICATE OF CORRECTION

PATENT NO.        : 7,202,494 B2                                           Page 1 of 1
APPLICATION NO. : 11/426969
DATED             : April 10, 2007
INVENTOR(S)       : Richard A. Blanchard et al.

It is certified that error appears in the above-identified patent and that said Letters Patent is hereby corrected as shown below:

| | |
|---|---|
| Cover page: Foreign Patent Documents, Page 1 | Delete: "0 843 631"<br>Insert: -- 0 843 361 -- |
| Cover page: Foreign Patent Documents, Page 1 | Delete: "61027661"<br>Insert: -- 61027681 -- |
| Column 1, Line 33 | Delete: "devices Published"<br>Insert: -- devices. Published -- |

Column 4, Line 55

Delete:

"
$$\mathbf{M}^{-1}_{h,ij}(E_F,T) = \frac{-\sum_{E>E_F} \int_{B.Z.} \left(\nabla_{\mathbf{k}} E(\mathbf{k},n)\right)_i \left(\nabla_{\mathbf{k}} E(\mathbf{k},n)\right)_j \frac{\partial f(E(\mathbf{k},n),E_F,T)}{\partial E} d^3\mathbf{k}}{\sum_{E>E_F} \int_{B.Z.} (1 - f(E(\mathbf{k},n),E_F,T)) d^3\mathbf{k}}$$
"

Insert:

--
$$\mathbf{M}^{-1}_{h,ij}(E_F,T) = \frac{-\sum_{E<E_F} \int_{B.Z.} \left(\nabla_{\mathbf{k}} E(\mathbf{k},n)\right)_i \left(\nabla_{\mathbf{k}} E(\mathbf{k},n)\right)_j \frac{\partial f(E(\mathbf{k},n),E_F,T)}{\partial E} d^3\mathbf{k}}{\sum_{E<E_F} \int_{B.Z.} (1 - f(E(\mathbf{k},n),E_F,T)) d^3\mathbf{k}}$$
--

Signed and Sealed this

Fourteenth Day of August, 2007

JON W. DUDAS
*Director of the United States Patent and Trademark Office*